United States Patent [19]
Lee et al.

[11] Patent Number: 5,625,529
[45] Date of Patent: Apr. 29, 1997

[54] PZT THIN FILMS FOR FERROELECTRIC CAPACITOR AND METHOD FOR PREPARING THE SAME

[75] Inventors: Wan-in Lee; Jun-ki Lee; Il-sub Chung; Chi-won Chung; In-kyung Yoo, all of Kyungki-do, Rep. of Korea

[73] Assignee: Samsung Electronics Co., Ltd., Suwon, Rep. of Korea

[21] Appl. No.: 412,043

[22] Filed: Mar. 28, 1995

[51] Int. Cl.[6] .................................................. H01G 4/06
[52] U.S. Cl. .................. 361/321.5; 361/305; 361/306.3; 361/321.4; 361/321.2; 361/313; 257/295; 29/25.42
[58] Field of Search ............................ 361/321.5, 313, 361/305, 321.4, 321.3, 306.3, 321.2, 311, 330; 257/295, 296; 29/25.42; 264/65

[56] References Cited

U.S. PATENT DOCUMENTS 5,314,651  5/1994  Kulwicki .................................. 264/65

FOREIGN PATENT DOCUMENTS 0469934A  2/1992  European Pat. Off. .

OTHER PUBLICATIONS

Lee et al., *Mat. Res. Symp. Proc.*, 361, 421–426 (1995).

*Primary Examiner*—Leo P. Picard
*Assistant Examiner*—Anthony Dinkins

[57] ABSTRACT

PZT ferroelectric thin films for capacitors comprise a combination of a donor dopant and an acceptor dopant in a total amount of about 0.1 to 8 mole percent of PZT, or Sc alone in an amount of about 0.1 to 5 mole percent. Nb or Ta is employed as a donor dopant, while Sc, Mg or Zn can be used as an acceptor dopant. The presence of a single Sc acceptor dopant, or both an acceptor dopant and a donor dopant, results in increased endurance. Fatigue cycles are increased on the order of about $10^5$ relative to dopant-free films. Doping with a single Sc acceptor dopant, or both an acceptor dopant and a donor dopant, reduces coercive field, allowing PZT films to switch at relatively low voltages. PZT thin films of a pure perovskite phase are obtained in which a pyrochlore phase is completely excluded. Pt may be used as an electrode material. The leakage current of PZT films doped with both the acceptor and donor elements are similar to the leakage current level of pure PZT thin films.

22 Claims, 6 Drawing Sheets

PZT THIN FILMS FOR FERROELECTRIC CAPACITOR AND METHOD FOR PREPARING THE SAME

BACKGROUND OF THE INVENTION

1. Field of the Invention

The present invention relates, in general, to $PbZr_xTi_{1-x}O_3$ (hereinafter referred to as "PZT") thin films for ferroelectric capacitors and, more particularly, to introduction of dopants for improvement in endurance properties and electrical properties of PZT films. The present invention is also concerned with methods for preparing the PZT ferroelectric thin films.

2. Description of the Prior Art

Of the ferroelectric materials used for capacitors, PZT exhibits exceptionally high polarization values and superiority in electrical and material properties. PZT, widely utilized for applications in ferroelectric devices, has a perovskite structure in which a phase transition between a tetragonal phase and a rhombohedral phase appears when the composition ratio of Zr to Ti is 53:47. Around this morphotropical phase boundary, PZT exhibits superior properties as a ferroelectric material with maximized polarization and dielectric constant.

A significant disadvantage of PZT as a ferroelectric material is in its inferior endurance. For example, when subjected to repeated switching, PZT shows a deterioration in polarization properties, such as reduction of remanent polarization and a distortion in the shape of the hysteresis loop. This phenomenon is known as fatigue.

In order to utilize ferroelectric materials as memory devices, these materials are required to have an endurance of $10^{12}$ cycles or more. In general, after $10^6$ cycles, pure PZT begins to show serious fatigue. After $10^9$ cycles, it no longer exhibits a ferroelectric property or the material itself is broken down.

To date, various efforts have been made to improve the endurance of PZT thin films for ferroelectric capacitors.

First, there was an attempt to change the electrode material from conventional Pt to a material selected from metal oxides with relatively good electroconductivity. It has been accepted that one of the known fatigue mechanisms for PZT thin film is the accumulation of an oxygen vacancy at the interface between the PZT thin film and the electrode in the ferroelectric capacitor. That is to say, oxygen vacancies randomly generated in the PZT thin film by repeated switching cycles are gradually accumulated at the interface between the PZT thin film and the electrode. The oxygen-vacant layer is expanded with the repetition of switching cycles, and finally the entire PZT thin film becomes electrically degraded. It has been recognized that a metal oxide electrode material can substantially accommodate the oxygen vacancies accumulated at the interface between the electrode and the PZT thin film and thus, the endurance of the PZT thin film can be significantly improved. As an example, it was reported that the electrode endurance cycle was notably improved by employing $RuO_2$ as an electrode material (See, D. P. Vijay, C. K. Kwok, W. Pan, I. K. Yoo and S. B. Desu, "Electrode Effects on Electrical Properties of Ferroelectric Thin Films", ISAF Proceedings 8th IEEE, 408 (1992)).

However, the use of a conductive metal oxide an electrode material results in an increase in the leakage current in a PZT ferroelectric capacitor. In addition, another problem is that the fabrication process for an electrode of a conductive metal oxide is too intricate to yield an electrode with good reproducibility.

Another attempt to improve the endurance of PZT thin films for ferroelectric capacitors was made by doping PZT with donors in order to reduce the oxygen vacancies in the PZT thin film. For example, La was employed as the dopant. However, PZT doped with La proved to be an unsuitable system because the remanent polarization rapidly decreased as the amount of the dopant increased. PZT was doped with other donor elements, Nd and Nb, by S. B. Desu et al. However, they could not achieve any appreciable improvement in the fatigue of the PZT films.

SUMMARY OF THE INVENTION

For solving the above problems, the present inventors have recognized that it is necessary to improve the fatigue of the PZT ferroelectric thin films without degrading other important properties.

Therefore, it is an object of the present invention to provide doped PZT thin films for ferroelectric capacitors, which have superior endurance without degrading the leakage current level.

It is another object of the present invention to provide doped PZT thin films for ferroelectric capacitors, capable of switching operations at low voltages.

It is a further object of the present invention to provide doped PZT thin films for ferroelectric capacitors consisting of a pure perovskite phase without a pyrochlore phase.

It is still a further object of the present invention to provide a simple method for preparing the doped PZT ferroelectric thin films.

It is still another object of the present invention to provide a ferroelectric capacitor containing the doped PZT thin films.

BRIEF DESCRIPTION OF THE DRAWINGS

The above objects and other features and advantages of the present invention will be more apparent from the following detailed description taken with reference to the accompanying drawings, in which.

DETAILED DESCRIPTION OF THE INVENTION

Figure 1:
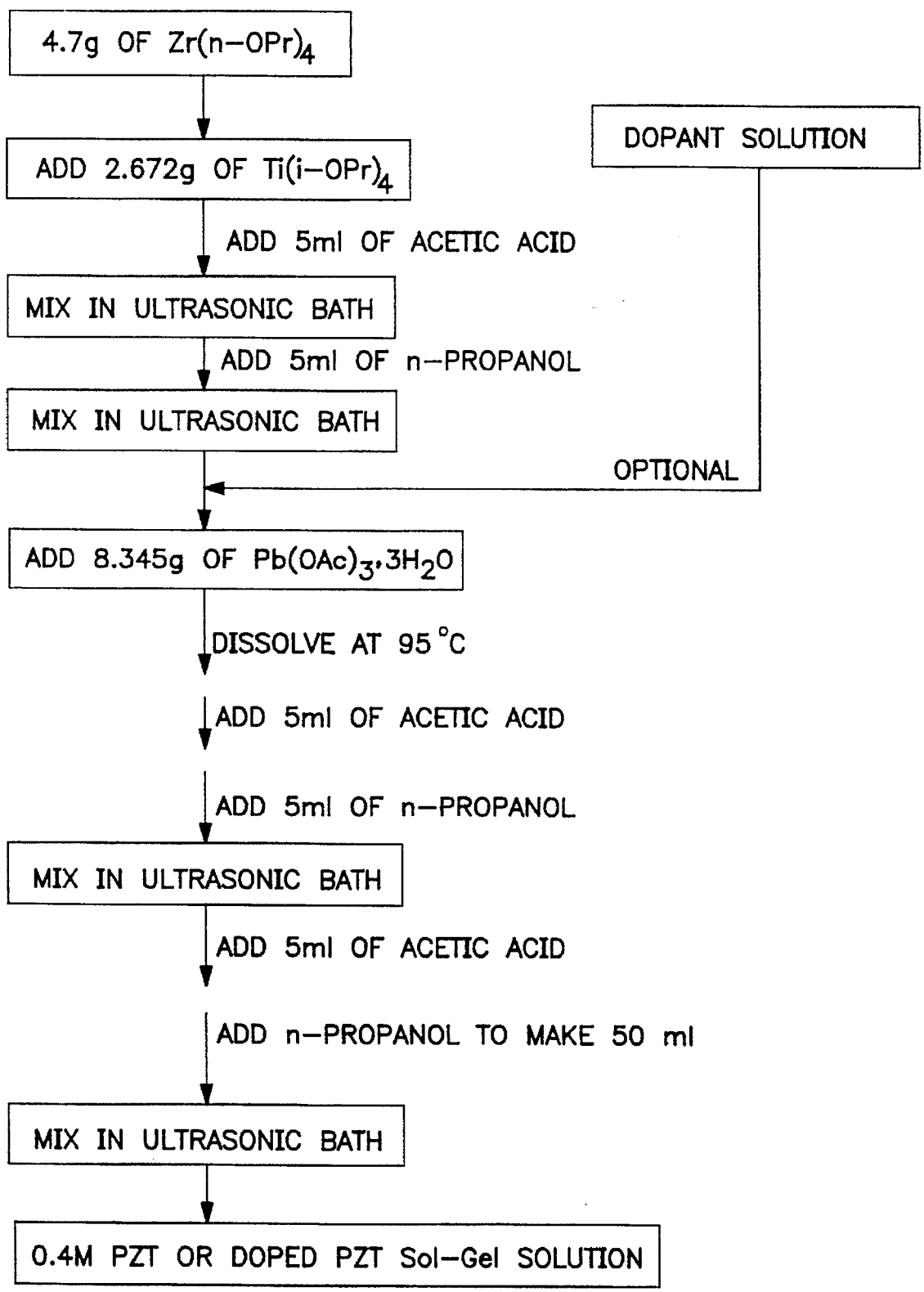
FIG. 1 is a flow chart illustrating preparation procedures for pure PZT and doped PZT sol-gel solutions.

In a PZT unit cell having a perovskite structure, Pb(2+) occupies an A site, a corner of the unit cell, and O(2−) is present at a face center. Ti(4+) and Zr(4+), which are small relative to Pb(2+) and O(2−), are positioned at a B site, which is an octahedral site and body centered. Accordingly, elements which are similar to Ti(4+) or Zr(4+) in size but have different valances could have great influence on the electrical and structural properties of PZT if they are doped into the PZT. For example, a donor with a valance of 5+ occupying a B site of PZT causes the oxygen vacancy to decrease, or the lead vacancy to increase, in the PZT structure, as represented by Equation I:

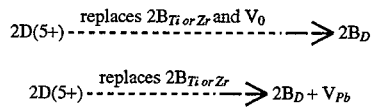

wherein D represents donor;

$V_O$ is oxygen vacancy;

$V_{Pb}$ is Pb vacancy;

$B_{Ti\ or\ Zr}$ means Ti or Zr staying at B site; and $B_D$ means donor occupying B site.

In considering size similarity, representative examples of the donor dopant include Nb(5+) and Ta(5+). However, measurement of the remanent polarization of a PZT ferroelectric thin film doped only with Nb(5+) or Ta(5+) shows that there is little improvement in endurance.

However, doping an acceptor element with a valance of 3+ or 2+ into the PZT structure gives rise to an increasing oxygen vacancy or a decreasing lead vacancy in the structure, as represented by Equation II:

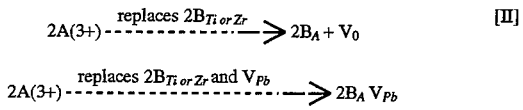

wherein A represents acceptor;

$V_O$ is oxygen vacancy;

$V_{Pb}$ is Pb vacancy;

$B_{Ti\ or\ Zr}$ means Ti or Zr staying at B site; and $B_A$ means acceptor occupying B site.

The doping effects of the acceptor dopants in conjunction with Zn(2+), Mg(2+) and Sc(3+) will now be described.

First, when doping PZT with Zn(2+), the value of the coercive field is not varied but the value of the remanent polarization becomes small in the resulting PZT ferroelectric capacitor. It was found from fatigue measurements that leakage current was significantly increased, while the endurance cycle was slightly improved.

In the case of Mg(2+) doping, the problems that arise when Zn(2+) is used as a dopant are aggravated. That is, the remanent polarization value is markedly reduced and the endurance cycle is scarcely improved.

By contrast, Sc(3+) brings about completely different effects. As will be explained in detail below, when PZT is doped with Sc(3+) alone, the coercive field is reduced, so that switching is easy. In addition, the remanent polarization of the doped PZT is almost similar to that of pure PZT. However, the value of the remanent polarization is reduced as the doping level of Sc(3+) increases and drops markedly when the density reaches 4 mole percent or more. Therefore, the amount of Sc(3+) introduced should be optimized. Measurement of the fatigue of the PZT doped with Sc(3+) alone, revealed that the endurance cycle is significantly improved to a degree that fatigue does not appear until about $10^{11}$ cycles.

Therefore, in accordance with an aspect of the present invention, there is provided a ferroelectric thin film for a capacitor, comprising PZT doped with Sc alone.

The small coercive field of Sc doped PZT films compared to that of pure PZT is based on the fact that switching operations are easy by virtue of the presence of Sc(3+) dopant alone. In other words, introduction of a Sc dopant into a perovskite structure leads to facile movement of a B site element. The ease of the switching operation is believed to be a factor contributing to the improvement in the endurance cycle.

As previously mentioned, the doping of acceptor elements such as Sc(3+), results in an increase in the oxygen vacancy or a decrease in the lead vacancy in the PZT thin film. The increased oxygen vacancy causes the leakage current to rise, advancing the progress of fatigue. However, an effect is that the problems caused by the lead vacancy could be reduced. That is to say, as the lead vacancy is decreased, the pyrochlore phase can be eliminated since it can only be present in the absence of lead. AS a result, the doped PZT consists essentially of a pure perovskite phase which can provide a superior endurance cycle.

As to amount of Sc(3+) dopant used in the practice of the present invention, it is preferred that the dopant is added in an amount of approximately 0.1 to approximately 5 mole percent of PZT. For example, if too much Sc (3+) dopant is used, the leakage current level is considerably increased. On the other hand, if too little Sc (3+) dopant is used, endurance is not improved.

In accordance with another aspect of the present invention, there is provided a ferroelectric thin film for a capacitor, comprising PZT doped with both an acceptor element and a donor element. Leakage current which may be caused by an acceptor element can be prevented by the introduction of both an acceptor dopant and a donor dopant into the PZT. In other words, the simultaneous presence of the acceptor dopant and donor dopant in PZT can avoid the detrimental influence generated from the charge imbalance. Therefore, the doped PZT thin films for ferroelectric capacitors display an improvement in leakage current as well as superior endurance.

Preferred acceptor dopants used in the present invention are those which are similar to Ti or Zr in ion size and which have a vacant d-orbital. Preferred acceptor dopants are representatively exemplified by Sc(+3), Zn(+2) and Mg(+2). When employing acceptor dopants having a partially occupied d-orbital, such as Fe, Cr, Ni, etc., problems may arise in that the resulting PZT ferroelectric capacitor has a small dielectric constant and increased leakage current.

Preferred donor dopants used in the present invention include Nb(5+) and Ta(5+).

A suitable combination of these acceptor and donor dopants results in structural improvement in PZT, avoiding vacancy generation attributable to charge imbalance in the PZT system. For example, the overall charge balance can be adjusted by doping PZT with a donor-acceptor combination, such as Nb(5+)—Sc(3+), Nb(5+)—Mg(2+), Nb(5+)—Zn(2+), Ta(5+)—Sc(3+), Ta(5+)—Mg(2+), and Ta(5+)—Zn(2+), the overall charge balance can be adjusted. Particularly preferred donor-acceptor combinations are selected from Nb(5+)—Sc(3+) and Ta(5+)—Sc(3+).

As the amount of dopant is increased, the remanent polarization of the doped PZT thin films is reduced. In accordance with the present invention, the amount of donor and acceptor element is preferably on the order of approximately 0.1 to approximately 5 mole percent of PZT. When a combination of Nb(5+)—Sc(3+) is used, the donor and the acceptor are preferably added in amounts ranging from approximately 0.1 to approximately 4 mole percent and approximately 0.1 to approximately 4 mole percent, respectively; a combination of Nb(5+)—Mg(2+), 0.1 to 5 mole percent and 0.05 to 2.5 mole percent, respectively; a combination of Nb(5+)—Zn(2+), 0.1 to 5 mole percent and 0.05 to 2.5 mole percent, respectively; a combination of Ta(5+)—Sc(3+), 0.1 to 4 mole percent and 0.1 to 4 mole percent, respectively; a combination of Ta(5+)—Mg(2+), 0.1 to 5 mole percent and 0.05 to 2.5 mole percent, respectively; and a combination of Ta(5+)—Zn(2+), 0.1 to 5 mole percent and 0.05 to 2.5 mole percent, respectively.

As will be described in detail below, the doped PZT thin films for ferroelectric capacitors according to the present invention exhibit significantly improved ferroelectricity. First, the leakage current can be reduced. It has been found that the leakage current level is similar to that of pure PZT films. Fatigue measurement demonstrates that the endurance cycle of the doped PZT thin films of the present invention is remarkably improved without the appearance of fatigue until about $10^{11}$ cycles. In addition, low voltage switching can be accomplished in the doped PZT thin films of the present invention by virtue of the reduced coercive field.

Figure 2:
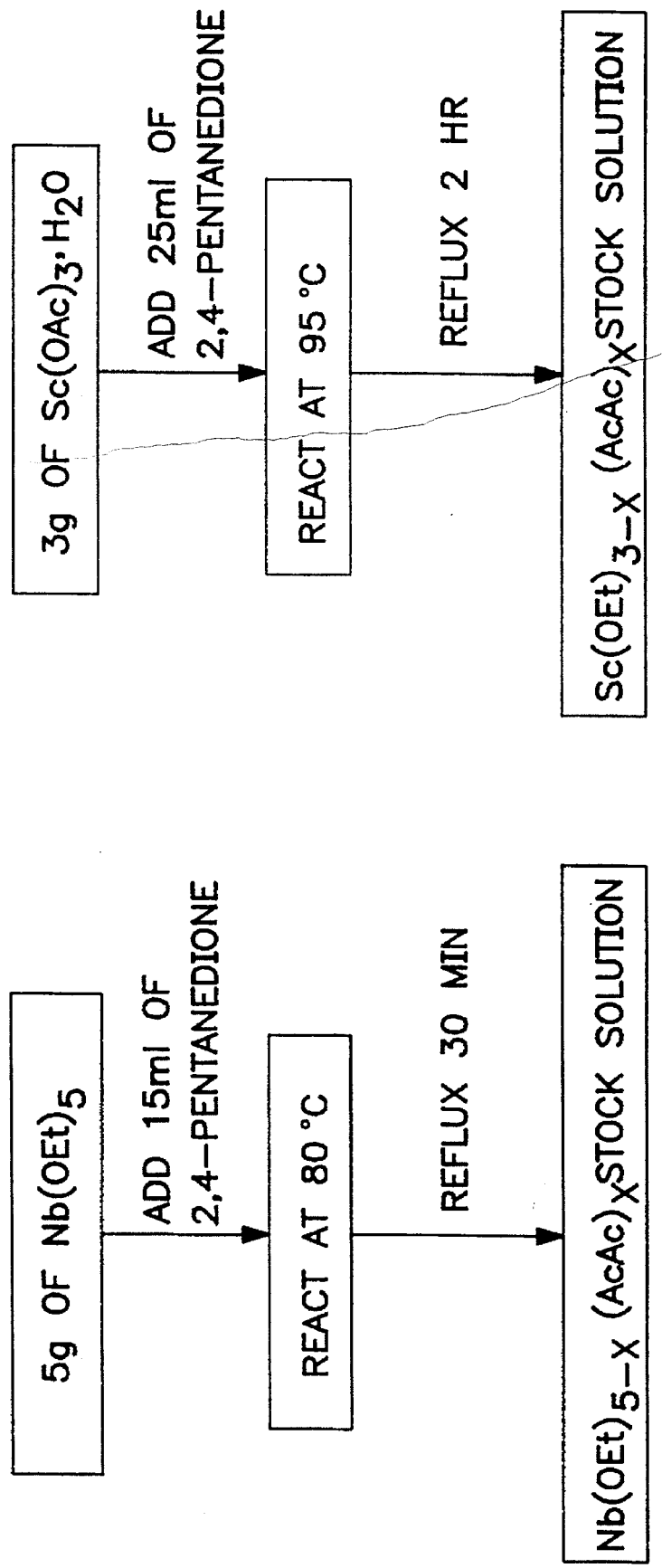
FIG. 2 is a flow chart illustrating preparation procedures for dopant solutions for doping PZT, according to the present invention.

FIGS. 1 and 2 show the preferred procedures for preparing PZT precursor sol-gel solutions and dopant stock solutions for PZT, respectively. These procedures will be generally described in connection with the drawings.

First, pure PZT precursor sol-get solution is prepared according to the instructions shown in FIG. 1.

4.70 g of Zr(n-OPr)$_4$ and 2.672 g of Ti(i-OPr)$_4$ are mixed together. 5 ml of acetic acid is added to this mixture and the resultant solution is mixed in an ultrasonic bath. To this solution, 5 ml of n-propanol is poured in and mixed. Next, 8.345 g of Pb(OAc)$_3$.3H$_2$O is added to this solution and the mixture is heated to 90° C. to achieve dissolution. Thereafter, 5 ml of acetic acid and 5 ml of n-propanol are added and mixed in an ultrasonic bath followed by addition of another 5 ml of acetic acid. Following this, n-propanol is added to make the resulting solution 50 ml. The resulting solution is mixed in the ultrasonic bath, to give a 0.4M pure PZT sol-get solution. The mole ratio of zirconium to titanium in this PZT sol-get solution is 53:47, with 10 mole percent Pb excess.

Second, for the preparation of a doped PZT sol-gel solution, dopant solutions are introduced to the mixture of Zr(n-OPr)$_4$ and Ti(i-OPr)$_4$ before adding the Pb(OAc)$_3$.3H$_2$O. The amounts of dopant are stoichiometrically adjusted.

For an acceptor dopant solution, 3 g of SC(OAc)$_3$.H$_2$O is added into 25 ml of 2.4-pentanedione and heated to 95° C. to cause a reaction, followed by reflux for 2 hours, as shown in FIG. 2. As a result, a stock solution of Sc(OEt)$_{3-x}$(AcAc)$_x$, wherein x=1~2, is obtained.

Separately, a donor dopant stock solution of Nb(OEt)$_{5-x}$(AcAc)$_x$, wherein x=1~4, is prepared for doping PZT by adding 5 g of Nb(OEt)$_5$ into 15 ml of 2.4-pentanedione, reacting the mixture at 80° C. and refluxing the products for 30 min., as shown in FIG. 2.

Stoichiometric amounts of the prepared doping stock solutions are added to the mixture of Zr(n-OPr)$_4$ and Ti(i-OPr)$_4$. The subsequent steps for the preparation of the doped PZT sol-gel solution of the present invention are the same as described above. A 1 mole percent Sc and 1 mole percent Nb doped PZT precursor solution is obtained as a result. Likewise, in this doped PZT sol-gel solution, the mole ratio of zirconium to titanium is 53:47 with 10 mole percent excess Pb.

The preferred embodiment of the present invention will now be further described with reference to the following specific example.

EXAMPLE 1

Figure 5:
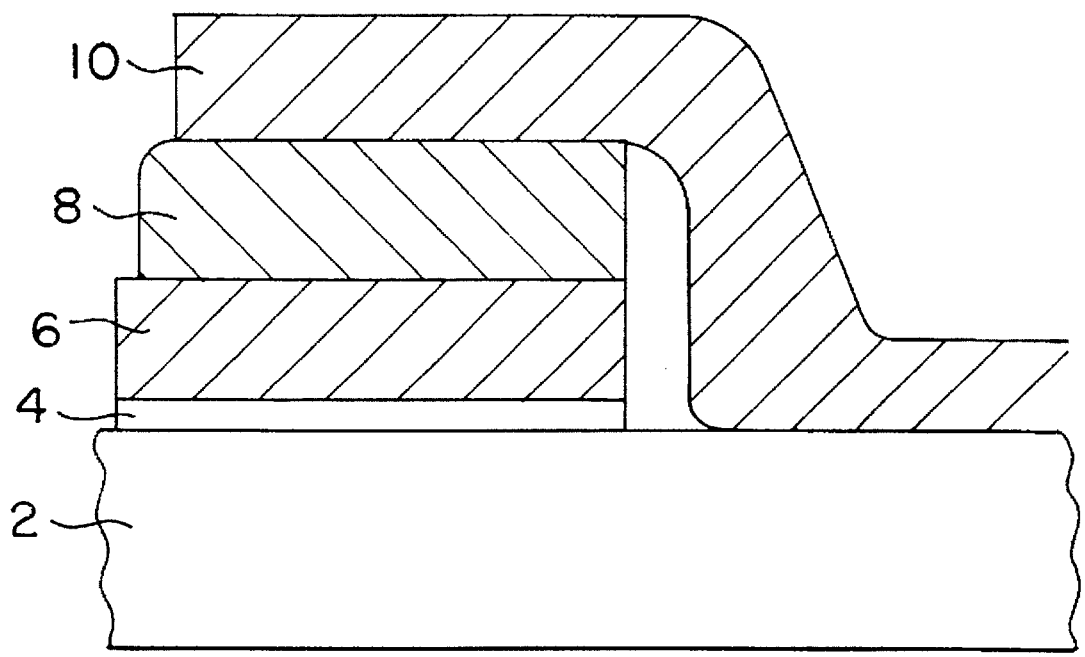
FIG. 5 shows a ferroelectric capacitor, including a thin film according to the present invention.

Preparation of a Ferroelectric Capacitor Using a PSNZT (1 mole percent Sc and 1 mole percent Nb Doped PZT) Thin Film and Ferroelectric Properties thereof The ferroelectric capacitor prepared as follows is shown in FIG. 5.

A silicon wafer 2 deposited with SiO$_2$ at a thickness of about 300 nm was utilized as a substrate on which a layer of Ti 4 was then deposited at a thickness of about 20 nm to provide good adhesion. Then, using a DC magnetron sputtering process, Pt was deposited at a thickness of 250 nm, to form a bottom electrode 6.

The mole percent Sc and 1 mole percent Nb doped PZT precursor solution, prepared according to the present invention, was deposited on the prepared bottom electrode using a spin coater at a speed of 2,000 rpm for 40 sec. Thereafter, the coating was baked at 150° C. for 10 min. This spin coating cycle was conducted again, followed by annealing at about 650° C. for 30 min. A PZT thin film 8 with a thickness of about 200 nm was obtained. X-ray diffraction analysis showed that the prepared PZT film crystallizes with a pure perovskite structure.

In order to measure the ferroelectric properties of this doped PZT thin film, a top electrode was prepared as follows.

First, using a shadow mask with a diameter of 75 μm, Pt was deposited at a thickness of 150 nm by a DC magnetron sputtering process, to form the top electrode 10. An ion milling process was used to etch the entire Pt electrode to a thickness of about 10 nm with the aim of removing a smeared Pt underneath the patterns of the shadow mask contacted with the PZT thin film. Subsequently, the film sample was subjected to annealing at 550°© for 20 min, to correct the ion damage which might be caused by the ion milling process.

Optical microscopy revealed that a top electrode prepared in this manner had a size of $4.5\times10^{-5}$ cm$^2$. The hysteresis loop, endurance and the leakage current of the doped PZT thin film were measured by a Standard RT66A (trademark, commercially available from Radiant Technologies Inc., USA), a RT6000HVS (trademark, commercially available from the same) and a HP8116A Pulse Generator (trademark, commercially available from Hewlett Packard), respectively.

EXAMPLE 2

Preparation of a Ferroelectric Capacitor Using a PSZT (2 mole percent Sc doped PZT) Thin Film and Ferroelectric Properties thereof A ferroelectric capacitor was prepared in a manner similar to that of Example 1, except that only the Sc(OEt)$_{3-x}$(AcAc)$_x$ stock solution, wherein x=1~2, was employed as a PZT dopant solution, to give a PZT precursor solution.

The ferroelectric capacitor was tested for hysteresis loop, endurance and leakage current using the same equipment as in Example 1.

COMPARATIVE EXAMPLE 1

Preparation of a Ferroelectric Capacitor Using A Pure PZT Thin Film and Electrical Properties thereof A ferroelectric capacitor was prepared in a manner similar to that of Example 1, except that no dopant solution was employed, to give a 0.4M PZT precursor solution.

The ferroelectric capacitor was tested for hysteresis loop, endurance and the leakage current by using the same equipment as in Example 1.

COMPARATIVE EXAMPLE 2

Preparation of a Ferroelectric Capacitor Using a PNZT (4 mole percent Nb doped PZT) Thin Film and Electrical Properties thereof A ferroelectric capacitor was prepared in a manner similar to that of Example 1, except that only the $Nb(OEt)_{5-x}(AcAc)_x$ stock solution, wherein x=1~4, was employed as a PZT dopant solution, to give a PZT precursor solution.

The ferroelectric capacitor was tested for hysteresis loop, endurance and leakage current using the same equipment as in Example 1.

Figure 3:
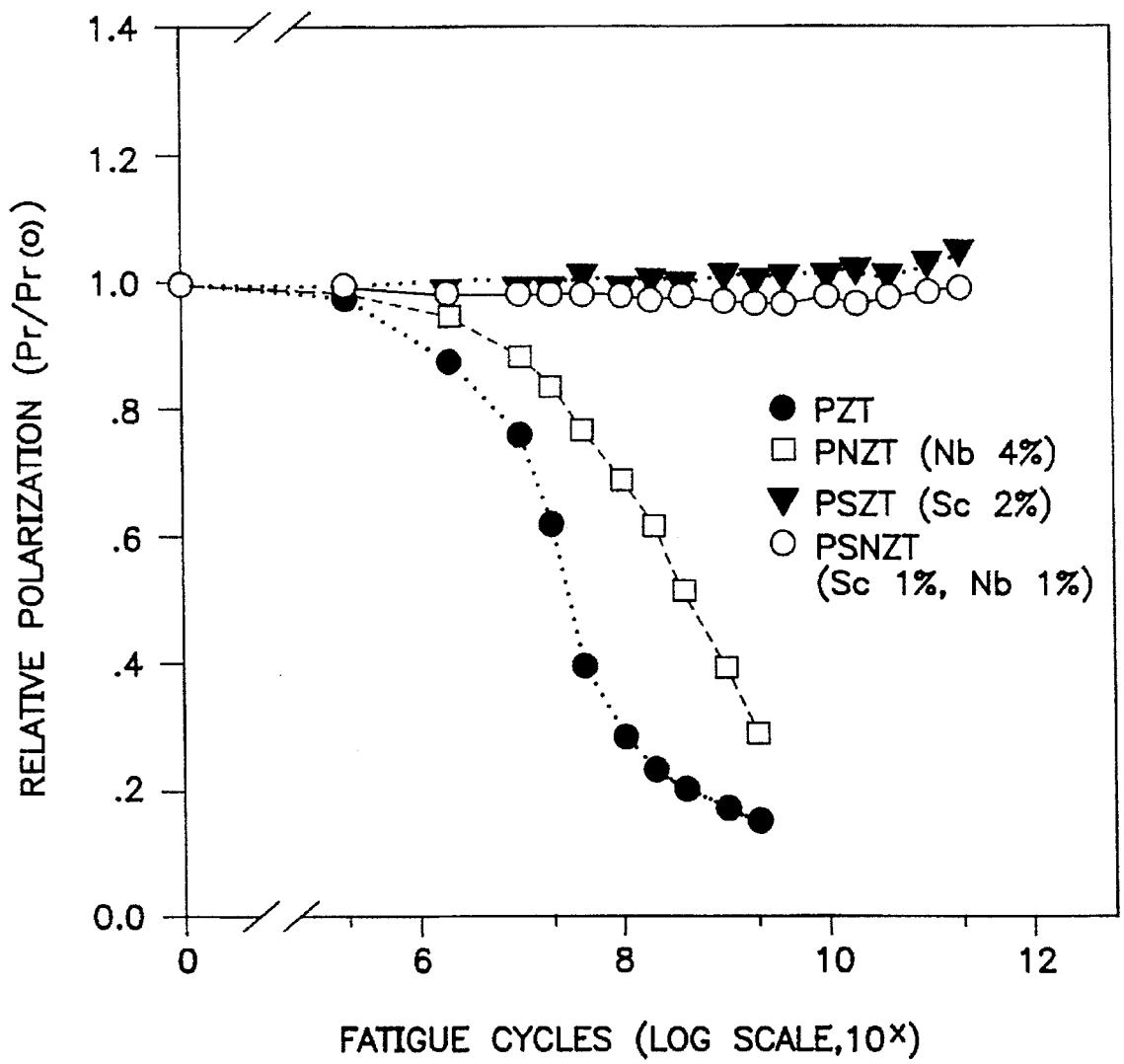
FIG. 3 shows the relative polarization of the present PZT thin films for ferroelectric capacitors and conventional PZT thin films with regard to fatigue cycles.
Figure 4A:
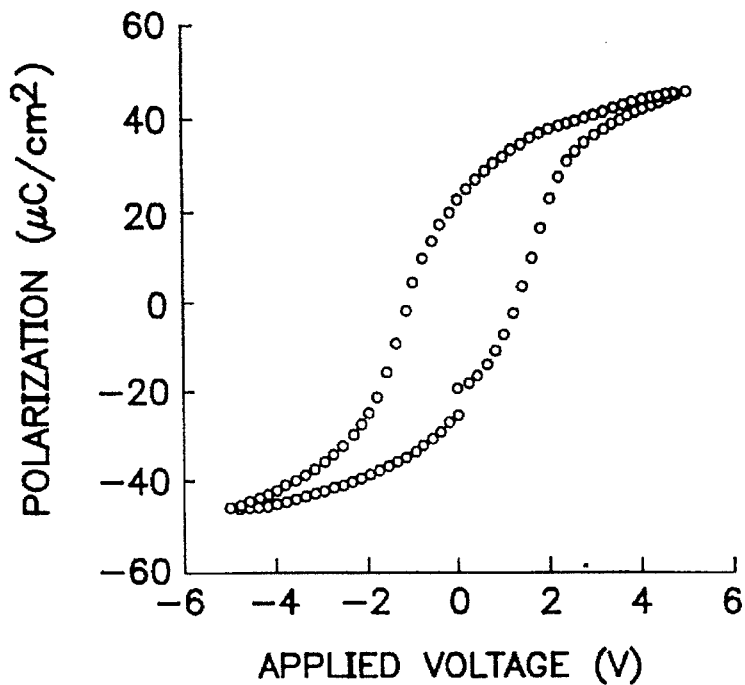
FIGS. 4A through 4D show ferroelectric hysteresis loops of a PZT thin film and doped PZT thin films.
Figure 4B:
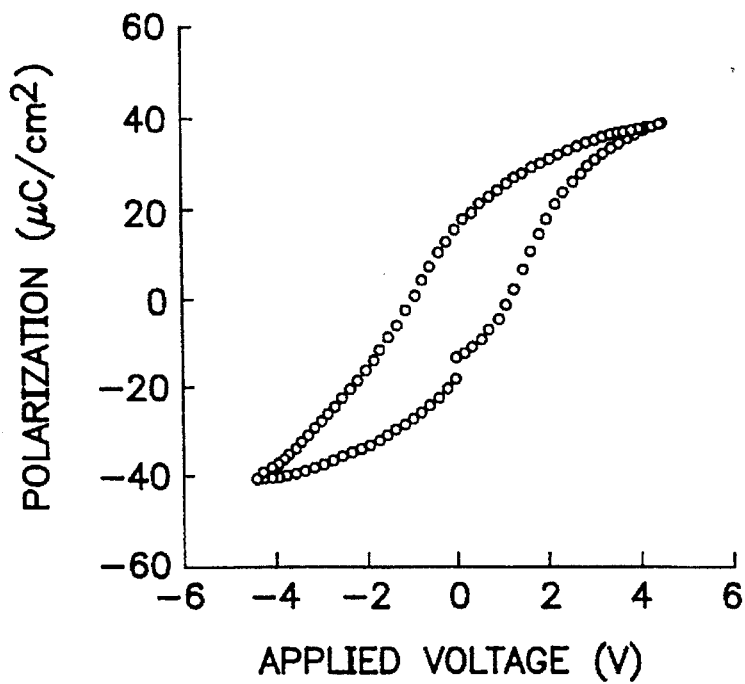
Figure 4C:
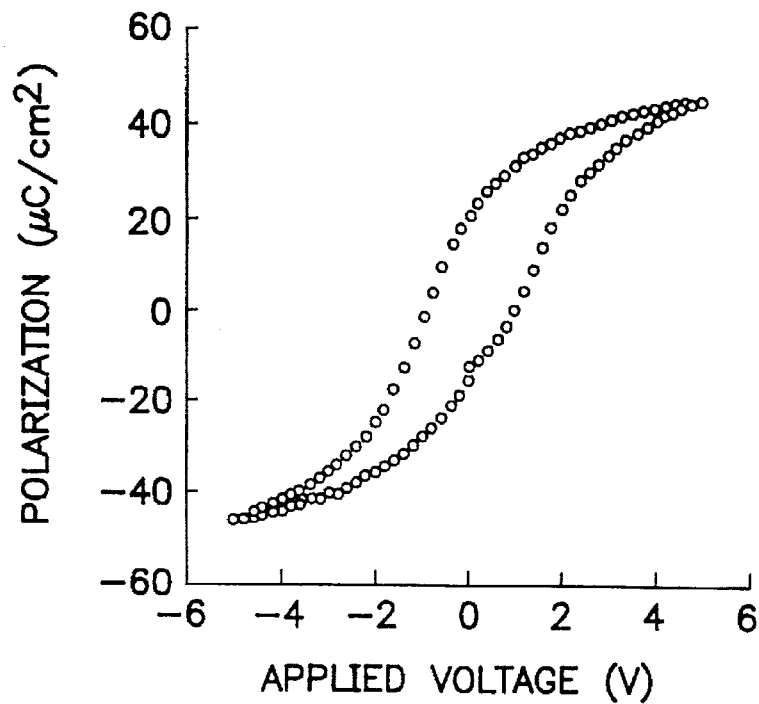
Figure 4D:
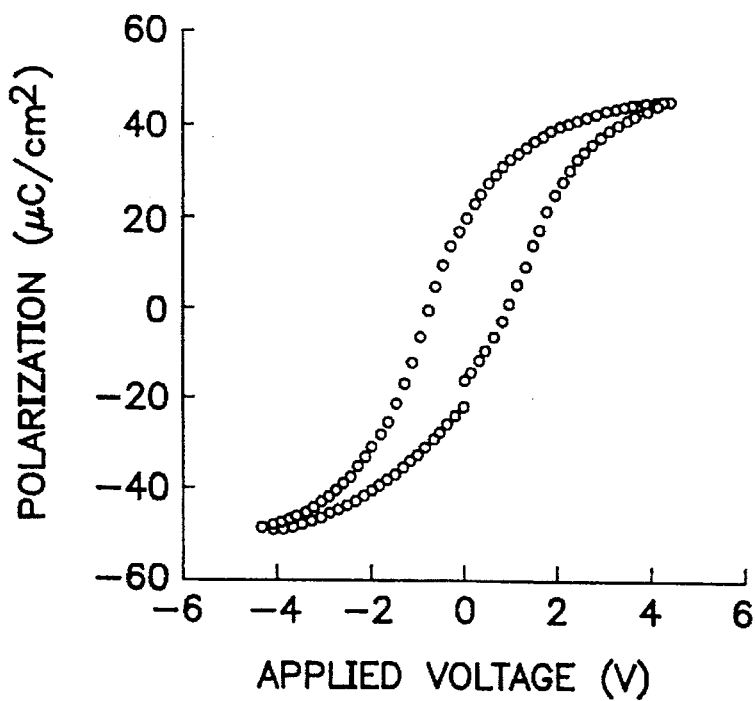

FIG. 3 shows the endurance of several PZT films including pure PZT and doped PZT. One MHz square with an amplitude of 5 V was used as a switching source. In the figure, the fatigue cycles are plotted against the relative polarization which is defined as a ratio of the remanent polarization values measured after the particular fatigue cycles and before the fatigue test.

As shown in this plot, the pure PZT thin film begins to show serious fatigue from about $10^6$ cycles. In the case of the 4 mole percent Nb doped PZT thin film, although endurance is slightly improved relative to the pure PZT case, the film is inferior with respect to fatigue. By contrast, the 2 mole percent Sc doped PZT thin film according to an aspect of the present invention shows superior endurance with little fatigue until about $10^{11}$ cycles. In this case, the remanent polarization value increases rather than decreases with fatigue cycles. This is believed to be attributed to the fact that the leakage current is increased during the fatigue cycles. Like the 2 mole percent Sc doped PZT thin film, the 1 mole percent Sc and 1 mole percent Nb doped PZT thin film according to another aspect of the present invention has superior electrical properties in that no fatigue appears until $10^{11}$ cycles, keeping the remanent polarization value constant.

FIG. 4 shows hysteresis loops for pure and doped PZT films. In order to generate the hysteresis loop, the applied voltage was varied within a range of from −5 V to +5 V. The remanent polarization is defined as a polarization value when the applied voltage is "zero". The coercive field is defined as the voltage when switching begins to occur, that is, when the hysteresis loop meets the x axis. FIGS. 4A, 4B, 4C and 4D are hysteresis loops for pure PZT, 4 mole percent Nb doped PZT, 2 mole percent Sc doped PZT and 1 mole percent Sc and 1 mole percent Nb doped PZT, respectively.

As shown by these hysteresis loops, the remanent polarizations of the four PZT ferroelectric capacitors are similar to one another. The PZT films according to the present invention, that is, the 2 mole percent Sc doped PZT film, and the 1 mole percent Sc and 1 mole percent Nb doped PZT film, display considerably reduced coercive fields relative to the other PZT films. Accordingly, the present 2 mole percent Sc doped PZT film and the 1 mole percent Sc and 1 mole percent Nb doped PZT film can be operated at lower voltages than the conventional PZT films.

As apparent from the above description and the accompanying drawings, the PZT thin films according to the present invention, that is, films prepared by doping PZT with either Sc alone or with both acceptor and donor elements, exhibit very extensive and intensive improvements as follows.

First, the presence in a PZT thin film of a single Sc acceptor dopant, or both an acceptor dopant and a donor dopant, results in a remarkable increase in endurance. Relative to a dopant-free film, the fatigue cycles increased on the order of about $10^5$ in a film doped with either Sc alone or both acceptor and donor dopants.

Second, the doping with single Sc acceptor dopant, or both acceptor dopant and donor dopant, reduces the coercive field, allowing the PZT film to switch at relatively low voltages.

Third, a PZT thin film of a pure perovskite phase can be obtained in which a pyrochlore phase is completely excluded.

Fourth, the PZT thin film doped with a single Sc dopant or both acceptor and donor dopants can be prepared in the same manner as a pure PZT thin film, and can utilize Pt as an electrode material.

Finally, the leakage current level of the PZT thin films with both acceptor and donor dopant is similar to the leakage current level of a pure PZT thin film.

Other features, advantages and embodiments of the present invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A ferroelectric thin film for a capacitor, comprising PZT doped with a combination of a donor element and art acceptor element in an amount of approximately 0.1 to approximately 8 mole percent of PZT.

2. A ferroelectric thin film for capacitor in accordance with claim 1, wherein said donor element is selected from the group consisting of Nb and Ta.

3. A ferroelectric thin film for a capacitor in accordance with claim 1, wherein said acceptor element is selected from the group consisting of Sc, Mg and Zn.

4. A ferroelectric thin film for a capacitor in accordance with claim 1, wherein said combination of donor element and acceptor element is comprised of Nb and Sc which are present in an amount of approximately 0.1 to approximately 4 mole percent and approximately 0.1 to approximately 4 mole percent, respectively.

5. A ferroelectric thin film for a capacitor in accordance with claim 1, wherein said combination of donor element and acceptor element is comprised of Ta and Sc which are present in an amount of approximately 0.1 to approximately 4 mole percent and approximately 0.1 to approximately 4 mole percent, respectively.

6. A ferroelectric thin film for a capacitor in accordance with claim 1, wherein said combination of donor element and acceptor element is comprised of Nb and Mg which are present in an amount of approximately 0.1 to approximately 5 mole percent and approximately 0.05 to approximately 2.5 mole percent, respectively.

7. A ferroelectric thin film for a capacitor in accordance with claim 1, wherein said combination of donor element and acceptor element is comprised of Ta and Mg which are present in an amount of approximately 0.1 to approximately 5 mole percent and approximately 0.05 to approximately 2.5 mole percent, respectively. percent of PZT.

8. A capacitor for a memory device, comprising a ferroelectric thin film of claim 1.

9. A ferroelectric thin film for a capacitor comprising PZT doped with Nb and Zn, in an amount of approximately 0.1 to approximately 5 mole percent and approximately 0.05 to approximately 2.5 mole percent, respectively.

10. A ferroelectric thin film for a capacitor comprising PZT doped with Ta and Zn, in an amount of approximately 0.1 to approximately 5 mole percent and approximately 0.05 to approximately 2.5 mole percent, respectively.

11. A ferroelectric thin film for a capacitor, comprising PZT doped with Sc alone as the sole dopant in the amount of approximately 0.1 to approximately 5 mole percent, based on the total weight of PZT.

12. A capacitor for a memory device, comprising a ferroelectric thin film of claim 11.

13. A method for preparing a ferroelectric thin film for a capacitor, comprising doping PZT with a combination of a donor element and an acceptor element in a total amount of approximately 0.1 to approximately 8 mole percent of PZT.

14. A method in accordance with claim 12, wherein said donor element is selected from the group consisting of Nb and Ta.

15. A method in accordance with claim 12, wherein said acceptor element is selected from the group consisting of Sc, Mg and Zn.

16. A method in accordance with claim 12, wherein said combination of donor element and acceptor element is comprised of Nb and Sc which are present in an amount of approximately 0.1 to approximately 4 mole percent and approximately 0.1 to approximately 4 mole percent, respectively.

17. A method in accordance with claim 12, wherein said combination of donor element and acceptor element is comprised of Ta and Sc which are present in an amount of approximately 0.1 to approximately 4 mole percent and approximately 0.1 to approximately 4 mole percent, respectively.

18. A method in accordance with claim 12, wherein said combination of donor element and acceptor element is comprised of Nb and Mg which are present in an amount of approximately 0.1 to approximately 5 mole percent and approximately 0.05 to approximately 2.5 mole percent, respectively.

19. A method in accordance with claim 12, wherein said combination of donor element and acceptor element is comprised of Ta and Mg which are present in an amount of approximately 0.1 to approximately 5 mole percent and approximately 0.05 to approximately 2.5 mole percent, respectively.

20. A method for preparing a ferroelectric thin film for a capacitor, comprising doping PZT with Nb and Zn in an amount of approximately 0.1 to approximately 5 mole percent and approximately 0.05 to approximately 2.5 mole percent, respectively.

21. A method for preparing a ferroelectric thin film for a capacitor, comprising doping PZT with Ta and Zn in an amount of approximately 0.1 to approximately 5 mole percent and approximately 0.05 to approximately 2.5 mole percent, respectively.

22. A method for preparing a ferroelectric thin film for a capacitor, comprising doping PZT with Sc alone as the sole dopant in an amount of approximately 0.1 to approximately 5 mole percent of PZT.

* * * * *